(12) United States Patent
Pasqualetto et al.

(10) Patent No.: US 9,780,664 B2
(45) Date of Patent: Oct. 3, 2017

(54) OPEN-CIRCUIT DETECTION IN A SWITCHING STRUCTURE

(71) Applicants: CONTINENTAL AUTOMOTIVE FRANCE, Toulouse (FR); CONTINENTAL AUTOMOTIVE GMBH, Hannover (DE)

(72) Inventors: Angelo Pasqualetto, Toulouse (FR); Marie-Nathalie Larue, Corronsac (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/119,527

(22) PCT Filed: Feb. 19, 2015

(86) PCT No.: PCT/EP2015/000376
§ 371 (c)(1),
(2) Date: Aug. 17, 2016

(87) PCT Pub. No.: WO2015/124305
PCT Pub. Date: Aug. 27, 2015

(65) Prior Publication Data
US 2017/0012530 A1      Jan. 12, 2017

(30) Foreign Application Priority Data
Feb. 21, 2014   (FR) ...................................... 14 51420

(51) Int. Cl.
    *G01R 31/02*   (2006.01)
    *H02M 3/158*   (2006.01)
    *H02H 7/08*    (2006.01)

(52) U.S. Cl.
    CPC .......... *H02M 3/158* (2013.01); *G01R 31/024* (2013.01); *H02H 7/0833* (2013.01); *H02H 7/0838* (2013.01)

(58) Field of Classification Search
    CPC ......... H02M 3/33592; H02M 7/53803; H02M 2001/007; G01R 19/165; G01R 31/026
    (Continued)

(56) References Cited

U.S. PATENT DOCUMENTS 5,111,123 A    5/1992   Hach et al.
7,548,070 B2   6/2009   Förster et al.
(Continued)

FOREIGN PATENT DOCUMENTS

FR    2986341 A1    8/2013

OTHER PUBLICATIONS

International Search Report, dated May 4, 2015, from corresponding PCT Application.

*Primary Examiner* — Rajnikant Patel
(74) *Attorney, Agent, or Firm* — Young & Thompson

(57) ABSTRACT

A power supply device, including: a switching structure for controlling a continuous current in an inductive load on the basis of at least one control signal of a power switch; and anomaly detection elements, generating at least one item of information about the detection of an anomaly of the open circuit type in the wiring from the load to the switching structure. The anomaly detection elements include: elements for measuring the current flowing in the inductive load; elements for comparing the measured current continuously with a threshold value; and elements for counting a time interval during which the measured current remains continuously below the threshold value, delivering the anomaly detection information if the counted time interval>a reference time interval, which is k times greater than a period of
(Continued)

the control signal, where k>1, and if the duty cycle of the control signal>a threshold value.

12 Claims, 5 Drawing Sheets

(58) Field of Classification Search
USPC ..... 363/16–17, 21.03, 21.07, 39, 41, 95–98; 324/543, 750.01
See application file for complete search history.

(56) References Cited

U.S. PATENT DOCUMENTS

| | | | |
|---|---|---|---|
| 8,400,131 B2* | 3/2013 | Li | H05B 33/0815 323/280 |
| 9,231,799 B2* | 1/2016 | Roper | H01Q 7/00 |
| 2008/0143340 A1 | 6/2008 | Forster et al. | |
| 2011/0025282 A1 | 2/2011 | Amighini et al. | |
| 2012/0043900 A1* | 2/2012 | Chitta | H05B 41/295 315/201 |
| 2012/0068721 A1* | 3/2012 | Moon | G01R 31/026 324/543 |
| 2015/0028840 A1* | 1/2015 | Pasqualetto | H02P 7/29 323/311 |

* cited by examiner

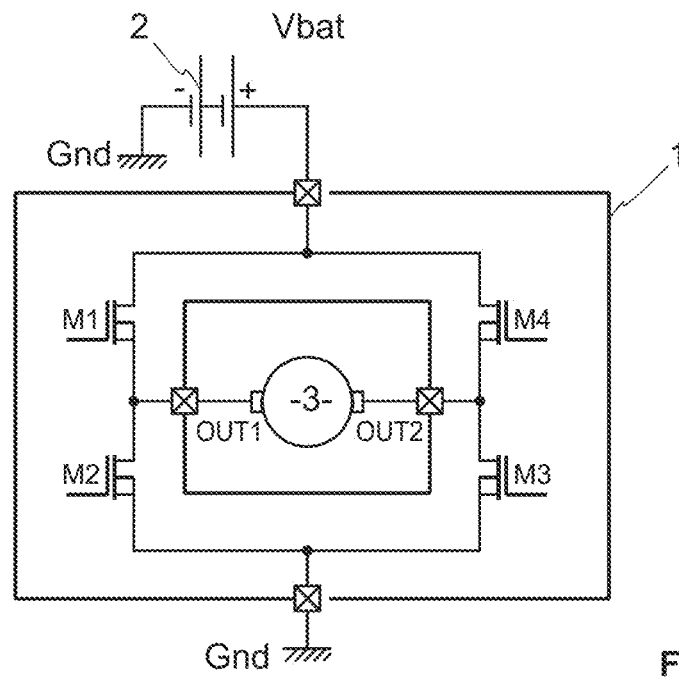
Figure 1
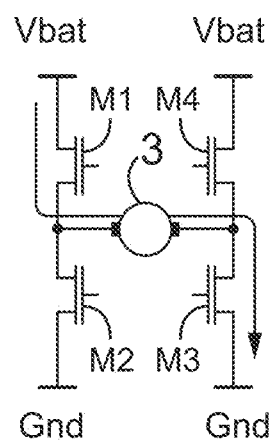
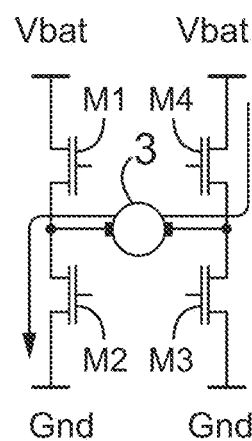
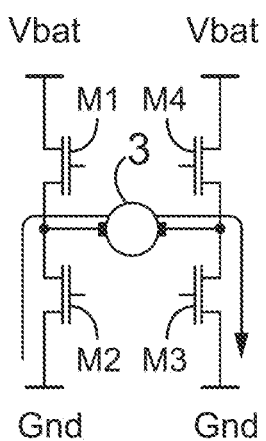
Figure 2a　　　　　Figure 2b　　　　　Figure 2c

OPEN-CIRCUIT DETECTION IN A SWITCHING STRUCTURE

The present invention relates in a general way to the control of inductive loads.

More specifically, it concerns the detection of anomalies such as open circuits that may appear in the wiring of a switching structure such as a transistor bridge, for example, which is adapted to control a current of specified value in an inductive load of this kind.

The invention can be applied, in particular, in the automobile field. It can be used, for example, in an electronic circuit incorporating a switching structure such as a transistor H-bridge.

In the automobile industry, these circuits are used to control the direction and/or the strength of the electric current in inductive loads such as electric motors.

These motors may be used in systems for the electronic control of an actuator. These may include, for example, a control device for the throttle (or ETC, "Electronic Throttle Control"), or for the exhaust gas recirculation valve (or "EGR device", where EGR is the abbreviation of "Exhaust Gas Recirculation"), or for any other valve used in the engine control or other systems. More generally, it may include any equipment driven by an electric motor, such as a window winder, for example.

The power supply of these inductive loads generally uses a switching structure such as a switch H-bridge. An H-bridge comprises four power switches, namely two "high-side" switches on the side of a positive power supply, for example a battery producing a positive supply voltage, and two "low-side" switches on the side of a negative power supply, or the ground. Each switch generally comprises a MOS ("Metal Oxide Semiconductor") power transistor.

The amount of current injected into the inductive load and delivered by the switching circuit is generally controlled by a sequence of analog control signals of the four transistors, produced on the basis of a setpoint control signal. The setpoint control signal and the analog control signals are generally pulse width modulated signals, or PWM signals ("Pulse Width Modulation").

The control of an inductive load can be divided into two major phases, namely the control phase, in which the current from the control circuit is injected into the inductive load according to a specified strategy, and a freewheel phase, in which the induced current from the inductive load is discharged into the circuit. The direction of flow of the current and the amount of current delivered to the inductive load are dependent on the duty cycle, as well as on different combinations of states of the analog control signals.

An example of the functional analysis of the system according to a layered architecture is detailed below. A hierarchically highest layer called the "application" layer 21 can be used to choose a parameter setting (initialization). The setpoint control signal is generated in a layer called the "control" layer 22 of the system, placed above a "command" layer 23, which is itself above a "hardware" layer 24 composed of the electronic components of the H-bridge. At the hardware and/or software implementation level, the "command" layer 23 and "hardware" layer 24 can be formed in the same integrated circuit. The "application" layer 21 and "control" layer 22 can be executed in the microprocessor of an automobile computer.

A specified strategy causes the H-bridge to be operated in certain specified configurations, at the frequency of the setpoint control signal. Conversely, other configurations are prohibited, such as a configuration in which a high-side switch and a low-side switch creating a short circuit between the battery and the ground would be closed simultaneously.

Physical anomalies may occur in the wiring of the switching structure, such as open circuits on the outputs of the H-bridge. During control phases of the inductive load, the appearance of these anomalies may cause malfunctioning of the actuator controlled by the H-bridge.

During freewheel phases, they may prevent the discharge of the current induced by the inductive load.

In some cases, these anomalies may cause irreversible harm to the controlled actuator (inductive load), or to the H-bridge.

To avoid the risks associated with the degradation of the actuator or of the H-bridge, or with the very existence of an open circuit in the system, there are techniques for detecting open circuits in a switching structure such as an H-bridge.

A possible technique is that of measuring the current continuity, using a current sensor such as an ohmmeter. The current strength established in the switching circuit is measured and is compared with a threshold value. If the measured current strength is below the threshold, an open circuit is considered to be present in the switching structure. This technique is simple and effective, but it has to be used when the H-bridge is in an inactivated state, that is to say outside the normal operation of the bridge.

A method known from U.S. Pat. No. 7,548,070 has the advantage, compared with the above technique, of being based on a principle of continuous measurement of voltages on the outputs of the switching structure, in an activated state of the H-bridge, that is to say during the normal operation of the bridge.

A drawback of the technique described in U.S. Pat. No. 7,548,070 arises if the load of the bridge is an electric motor and this motor reaches a high rotation speed as a result of a control signal with a high duty cycle. When the control signal subsequently ceases, the back electromotive force of the motor is high and may cause a sudden drop in current, or even invert the direction of the current between the two outputs of the H-bridge. This phenomenon, which is essentially transient, then causes a false detection.

The object of the invention is to overcome, or at least mitigate, all or some of the drawbacks of the aforementioned prior art.

For this purpose, a first aspect of the invention proposes a device for supplying an inductive load, comprising:
  a switching structure such as an H-bridge, comprising at least one power switch such as a MOS transistor, and adapted to control a current in the inductive load on the basis of at least one control signal of the at least one power switch, the control signal being pulse width modulated;
  means for detecting anomalies of the open circuit type in the wiring from the inductive load to the switching structure, adapted to generate at least one item of information about anomaly detection.

The device is remarkable in that the anomaly detection means comprise:
  current measurement means adapted to measure the current continuously in the inductive load;
  comparison means adapted to compare the measured current continuously with a threshold current value;
  time counting means for counting a time interval during which the measured current remains continuously below the current threshold value, and for delivering the anomaly detection information only if the counted time interval is greater than a specified reference time interval, which is k times greater than a period of the control signal of the at least one power switch, where k is a number greater than unity.

The proposed solution advantageously allows an open circuit to be detected in the activated state of the H-bridge, that is to say during the normal operation of the power supply device. This allows continuous detection of potential anomalies of the open circuit type in the wiring of the inductive load.

The chronometer can be used to count the time interval during which the current flowing through the H-bridge is below the current threshold, during both the control phases of the bridge (when the PWM signal is in the high state) and the freewheel phases (when the PWM signal is in the low state), but during more than one period of the PWM signal. Thus the end result is the time filtering of the open circuit detection information, making it possible to avoid the effects of transient phenomena which cause false detection in prior art devices.

In some embodiments, the device may be adapted so that the anomaly detection information is delivered only if the duty cycle of the control signal exceeds a threshold value, for example 10%. This makes it possible to avoid potential detection errors when the controlled current in the inductive load is low. This is because a low controlled current in the inductive load may, in certain conditions of use, be interpreted as reflecting an anomaly of the open circuit type, and may thus generate a false alarm.

According to other embodiments of the device, some or all of the following procedures may be provided, separately or in combination:
  the device may further comprise serial communication means adapted to enable the device to communicate with a control unit outside the device;
  the device may comprise a storage register adapted to store the threshold value of the duty cycle received from the external control unit via the serial communication means in the form of a uniform value at a time;
  the device may further comprise programmable storage means, adapted to store a modifiable value of the current threshold;
  the programmable storage means may be programmed by the external control unit via the serial communication means.

A second aspect of the invention relates to a method for supplying an inductive load with the aid of a device comprising:
  a switching structure such as an H-bridge, comprising at least one power switch such as a MOS transistor, and adapted to control a current in the inductive load on the basis of at least one control signal of the at least one power switch, the control signal being pulse width modulated, and
  means for detecting anomalies of the open circuit type in the wiring from the inductive load to the switching structure, adapted to generate at least one item of information about anomaly detection, the method comprising:
    measuring the current in the inductive load;
    comparing the measured current with a current threshold value;
    counting a time interval during which the measured current remains continuously below the current threshold; and
    delivering the anomaly detection information only if the counted time interval is greater than a specified reference time interval, which is k times greater than a period of the control signal of the at least one power switch, where k is a number greater than unity.

Other characteristics and advantages of the invention will become more apparent in the light of the following description. This description is purely illustrative and is to be read with reference to the attached drawings, in which:

FIG. 1 is a functional diagram of an example of a switching structure such as an H-bridge;

FIGS. 2a, 2b and 2c are diagrams illustrating different configurations for the control of an inductive load by pulse width modulation using the H-bridge of FIG. 1;

Figure 3A:
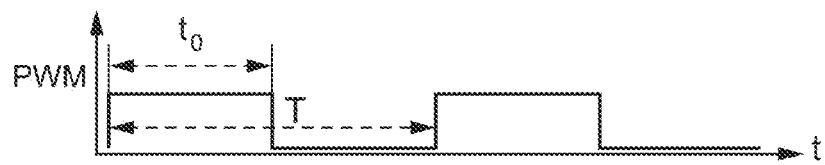
FIGS. 3a and 3b are graphs showing a periodic pulse width modulated setpoint control signal, and the corresponding variation of the current in the controlled inductive load.

Some embodiments are described below in an example of application to an integrated circuit for controlling the direction and/or strength of the electric current in an inductive load such as an electric motor used in a motor vehicle.

As shown schematically in FIG. 1, an H-bridge comprises four power switches, namely two "high-side" switches M1 and M4 on the side of a positive power supply, for example the vehicle battery 2 producing a positive supply voltage Vbat, and two "low-side" switches M2 and M3 on the side of a negative power supply, or the ground Gnd of the vehicle.

This switching structure comprises four switches, each having, for example, an MOS power transistor. A first transistor M1 is connected between a positive supply terminal, brought to the voltage of the battery Vbat for example, and a first node OUT1. A second transistor M2 is connected between said node OUT1 and a ground terminal Gnd. A third transistor M3 is connected between a second node OUT2 and the ground terminal Gnd. Finally, a fourth transistor M4 is connected between the positive supply terminal Vbat and said second node OUT2. The transistors M1 and M4 are called "high-side" transistors, and the transistors M2 and M3 are called "low-side" transistors.

The node OUT1 between the first high-side transistor M1 and the first low-side transistor M2, which are in series between the positive supply source Vbat and the ground Gnd, corresponds to a first output of the H-bridge. Similarly, the node OUT2 between a second high-side transistor M4 and a second low-side transistor M3, which are in series between the positive supply source Vbat and the ground Gnd, corresponds to a second output of the H-bridge.

The inductive load, for example an electric motor 3 in the example shown in FIG. 1, is connected between the outputs OUT1 and OUT2 of the H-bridge.

A sequence of analog control signals of the four transistors M1 to M4, respectively, is produced on the basis of a setpoint control signal. The latter is generated in a layer called the "control" layer 22 of the system, placed above a "command" layer 23, which is itself above a "hardware" layer 24 composed of the actual electronic components of the H-bridge. This sequence is produced according to a control strategy specified in an "application" layer 21.

This strategy causes the H-bridge to be operated in certain specified configurations. Conversely, other configurations are prohibited, such as a configuration in which the switches M1 and M2 would be closed simultaneously, in order to avoid connecting the battery 2 to the ground Gnd.

Typically, the H-bridge can be controlled according to three possible configurations or states, described below with reference to FIGS. 2a, 2b and 2c.

In a first state, shown in FIG. 2a, the pair formed by the high-side transistor M1 and the low-side transistor M3 enables these transistors, when they are conducting (closed switches), to cause a current to flow through the motor 3 in a first direction, from the positive supply source Vbat toward the ground Gnd, as indicated by an arrow in FIG. 2a. The transistors M2 and M4 are then blocked (open switches).

Conversely, in a second state, shown in FIG. 2b, the pair formed by the low-side transistor M2 and the high-side transistor M4 enables these transistors, when they are conducting (closed switches), to cause a current to flow through the motor 3 in the other direction, again from the positive supply source Vbat toward the ground Gnd, as indicated by the arrow in FIG. 2b. The transistors M1 and M3 are then blocked (open switches).

Finally, in a third state shown in FIG. 2c, the high-side transistors M1 and M4 are blocked (open switches) and the low-side transistors M2 and M3 are conducting (closed switches). This enables the energy stored in the inductive load, in this case the motor 3, to be discharged in the form of a current flowing toward the ground Gnd through M2 and M3, as shown by the arrow in FIG. 2c. This state is described as the "freewheeling" state or configuration. It can be established in following an operation of the H-bridge in the first or the second aforementioned state, after the opening of the transistor M1 or the transistor M4 respectively, and the closing of the transistor M2 or the transistor M3 respectively.

It should be noted that the freewheel produced by the low-side transistors M2 and M3 in the example of FIG. 2c may also be produced by other means. For example, it may be produced by means of the high-side transistors M1 and M4, that is to say by putting the transistors M1 and M4 in the conducting state and the transistors M2 and M3 in the blocked state. Structural diodes can also be used, making it possible to have a single conducting transistor, or even no transistor at all, in a fast freewheel configuration. According to the freewheel configuration used, the speed of the current decrease during the freewheel phase may vary.

Clearly, the invention is not limited by the type of switching structure. Notably, it can also be applied to a half-bridge switching structure, that is to say one with only two MOS power transistors (one high-side transistor and one low-side transistor), or to a switching structure with only one power switch, for example a voltage chopper.

Equally, the embodiment of the power switch or switches shown in FIGS. 2a, 2b and 2c is purely a non-limiting example. These switches may each comprise another type of field effect transistor (FET), a bipolar junction transistor (BJT), or an insulated gate bipolar transistor (IGBT), or another type, in place of a MOS transistor. They may also comprise an assembly of these transistors, with other components if required, such as resistors, capacitors, etc.

Figure 3B:
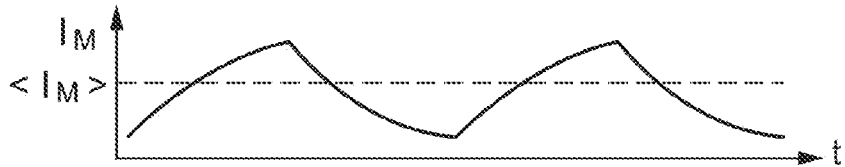

With reference to the timing charts of FIGS. 3a and 3b, the current in the inductive load 3 is controlled by pulse width modulation of a periodic setpoint control signal PWM. This signal has a given duty cycle τ0, and is used to generate control signals for the transistors M1-M4 of the transistor bridge.

The setpoint signal PWM has a frequency which may be as much as 20 kHz, giving a period T of approximately 50 µs. In the great majority of cases, the frequency used is 1 kHz.

As shown in FIG. 3a, this setpoint control signal PWM, in each period T, is in a first logic state determined from the high and low logic states during at least a first fraction of the time interval T, and is in the other logic state during the rest of the period. In the example shown in FIG. 3a, the setpoint control signal PWM is in the high logic state (active state) during a fraction of the period T having a duration $t_0$ which is shorter than the T, called the activation time interval. The setpoint duty cycle τ0 is given by:

$$\tau 0 = t_0/T \qquad [1]$$

The setpoint duty cycle τ0 may vary between 0% and 100%.

FIG. 3b shows the variation of the instantaneous value of the current $I_M$ in the motor 3, in response to the setpoint control signal PWM of FIG. 3a.

During the time interval of activation of the setpoint signal PWM, that is to say, in the example, when this signal is in the high logic state, the current $I_M$ in the electric motor 3 increases toward a nominal value determined by the ratio between the voltage of the battery 2 and the total resistance. The H-bridge is then controlled in the first or second state, shown in FIGS. 2a and 2c respectively, on the basis of the desired direction of rotation of the motor 3.

During the period of inactivation of the setpoint signal PWM, that is to say, in the example, when this signal is in the low logic state, the current $I_M$ decreases toward the zero value. The H-bridge is then controlled in the third state, or freewheel state, shown in FIG. 2c.

Because of the inductive nature of the load formed by the motor 3, the increases and decreases of the current $I_M$ have a gentle gradient, instead of following the form of the square edges of the setpoint control signal PWM.

The mean value $<I_M>$ of the current $I_M$ is given by:

$$<I_M> = \tau 0 \times Vbat \times 1/R \qquad [2]$$

where R is essentially the value of the impedance of the motor 3. The other resistive elements are the conduction resistances $Rds_{ON}$ of the conducting transistors, and the resistance of the wires, the connections, and the tracks of the integrated circuit.

Physical anomalies may appear in the application wiring, particularly in the form of open circuits at the outputs OUT1 and OUT2. The expression "open circuit" is to be understood as a contact resistance which, without necessarily being infinite, is abnormally high because of a fault in the connection of the inductive load, in this case the motor 3, to the outputs OUT1 and OUT2 of the H-bridge. This fault may be present at the time of installation, or may appear over time because of ageing and the conditions (heat, vibration, or the like).

They can be detected by measuring the current in the transistors, in the form of an abnormal current drop in certain configurations of the H-bridge.

These open circuits, when they appear, prevent the discharge of the energy accumulated in the inductive load 3 during the freewheel phases. This may affect the correct operation of the H-bridge and of the system comprising the controlled inductive load.

Detection of anomalies of the open circuit type is executed so that an appropriate response can be provided, for example in the "application" layer 21 of the system placed above the "control" layer 22. This appropriate response may, for example, form part of the diagnostic functionality of the motor vehicle.

In order to filter out false detections which may be due to a major collapse of current in the inductive load 3 when the control signal ceases, owing to the electromotive force of the electric motor started at high speed, a mechanism is implemented in the "command" layer 21 to generate a threshold time interval for open circuit detection corresponding to a reference time interval T0. This reference time interval T0 may be programmable. It is k times greater than the period T of the control signal PWM. In other words, the open circuit detection is not restricted to configurations of the H-bridge corresponding to freewheel operation. On the contrary, the proposed embodiments can be used to detect an open circuit in both the control configurations and the freewheel configurations of the H-bridge.

Advantageously, in order to avoid possible errors in measurement, the invention proposes a device for detecting an open circuit above a programmable and specified duty cycle. In fact, when the duty cycle τ0 of the control signal PWM is less than 10%, the current flowing in the inductive load is so low that it may be close to the current threshold used to characterize an open circuit, which may give rise to false open circuit detection in some cases. To respond to this problem, in one embodiment the device according to the invention delivers the anomaly detection information only if the duty cycle τ0 of the operating signal of the H-bridge is greater than 10%. This makes it possible to provide more reliable open circuit detection.

As mentioned in the introduction, anomaly checking is carried out in the "command" layer 23 of the system. For open circuit detection, for example, this can be done by monitoring the current in the inductive load in order to detect whether it is abnormally low. If this is the case, it means that an open circuit may be developing, as manifested by a rise in impedance. It is then determined that an anomaly of the open circuit type is present.

In some embodiments, this anomaly is detected if the current measured in a transistor of the H-bridge is below a current threshold value during a given time interval, which is greater than k times the period T, where k is a real number greater than unity. The corresponding information is then signaled to the "control" layer 21 of the system.

Figure 4A:
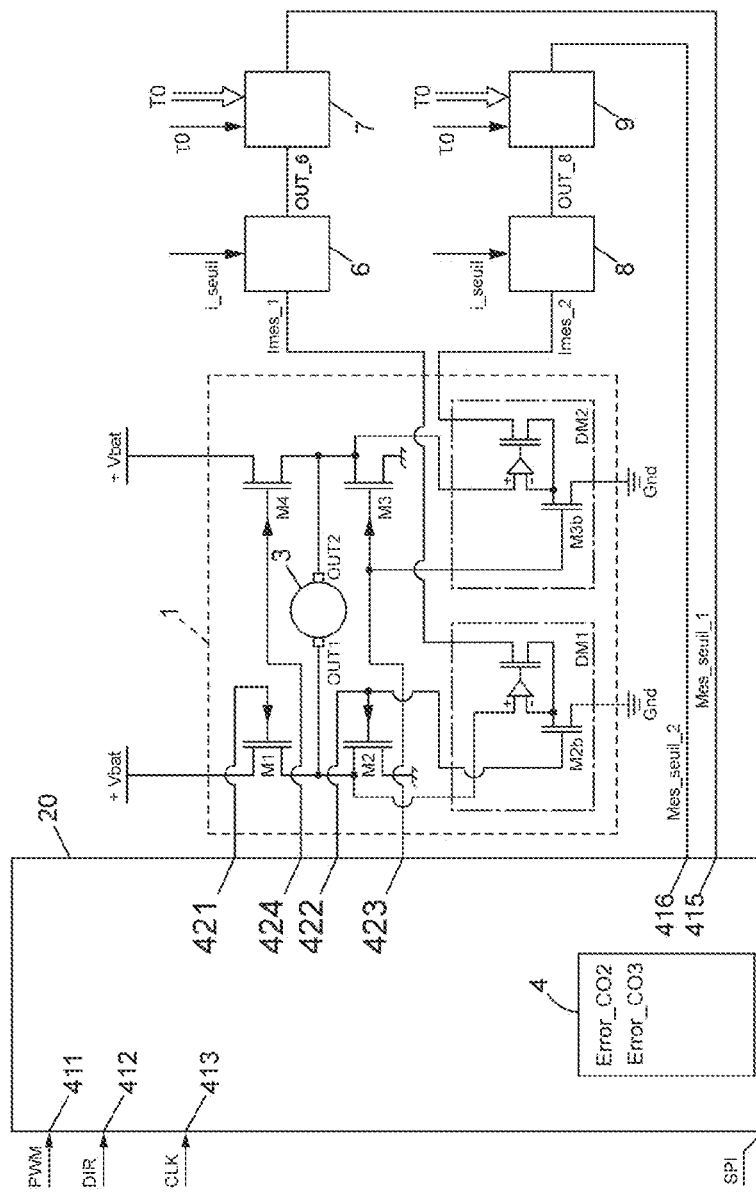
FIGS. 4a, 4b and 4c are functional diagrams of examples of control devices according to some embodiments.
Figure 4B:
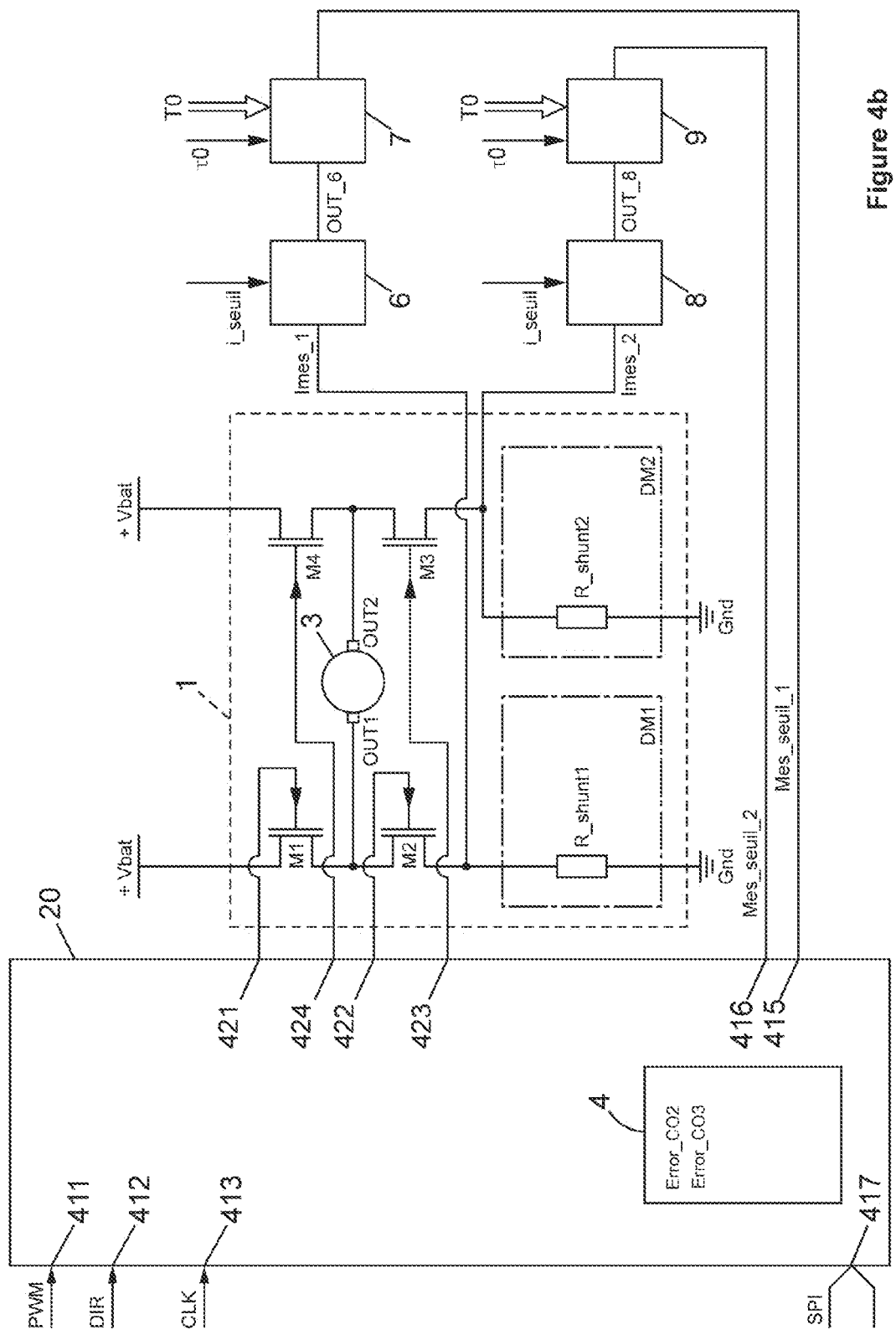
Figure 4C:
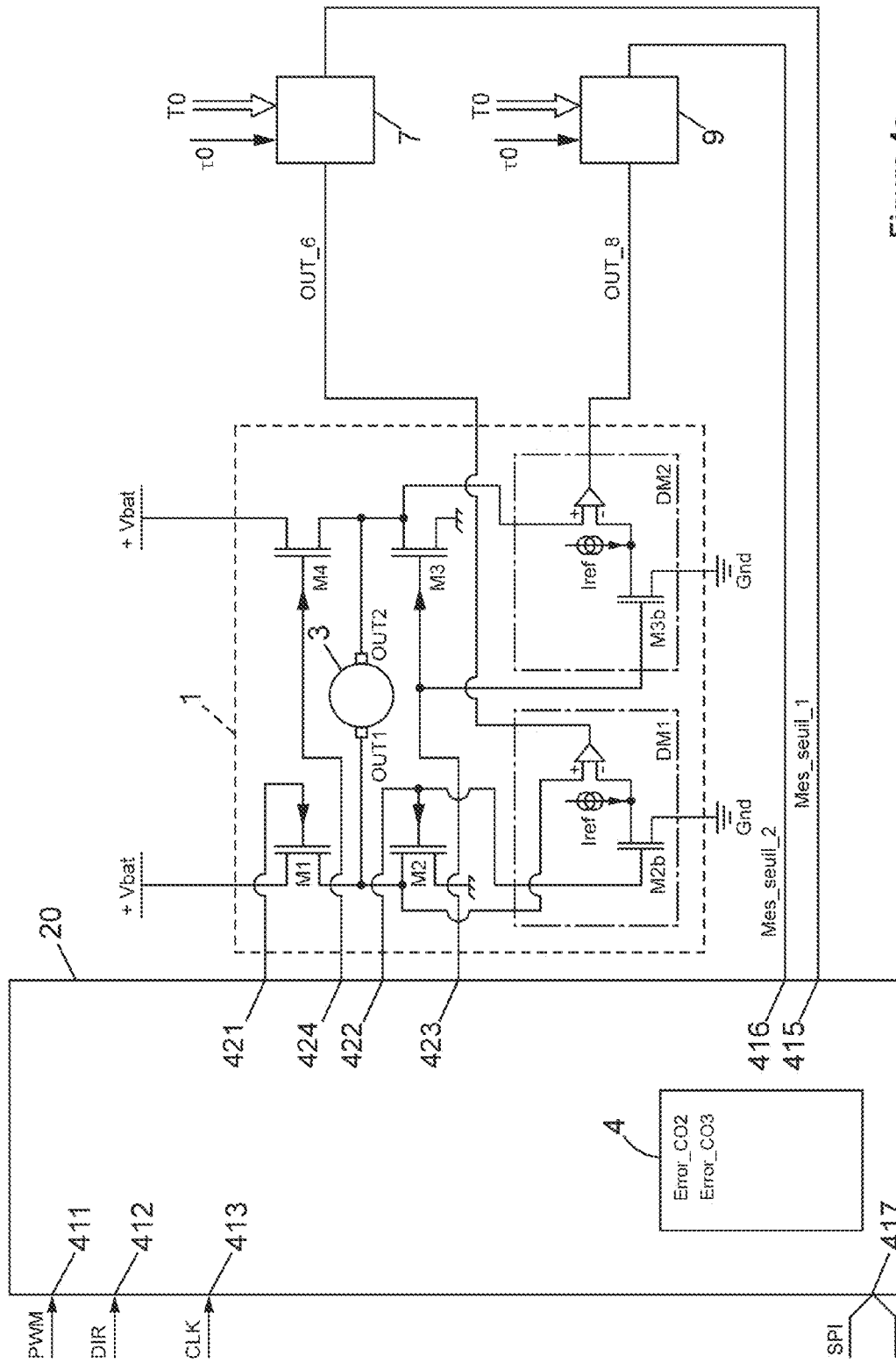

Some embodiments of a control device are shown schematically in FIGS. 4a, 4b and 4c. Their operation is explained below with reference to the graphs of FIG. 5, for a specified transistor of the H-bridge, for example the low-side transistor M3. These graphs show the current measured in the transistor M3 as a function of time, when the H-bridge is in a control configuration, for example one of those shown in FIGS. 2a and 2b, or in the freewheel configuration shown in FIG. 2c. The graphs correspond to normal operation, that is to say operation in the absence of any anomaly for two consecutive periods of the setpoint control signal PWM, followed by operation in the presence of an anomaly of the open circuit type during the following three periods.

With reference to FIG. 4a, the device may be made in the form of an integrated circuit, for example an ASIC ("Application Specific Integrated Circuit"), or the like. It may be coupled to a control unit 20, for example a microcontroller, a microprocessor, or the like. In a variant, the device may be integrated into the control unit 20, which may be made in the form of a control module dedicated to the control of the power circuit comprising the MOS transistors, for example an intelligent power ("smart power") circuit. The control unit 20 may also be a "stand-alone" integrated circuit, the controlled MOS transistors then being the only separate components.

The functionality of the control unit 20 corresponds to a "command" layer 23 of the system, in terms of the layer model to which reference has already been made above for the modeling of the system.

The device of FIG. 4a further comprises a transistor bridge 1, such as an H-bridge, an inductive load 3 such as an electric motor for example, a control unit 20, a first current measurement device DM1, a second current measurement device DM2, a first comparison device 6, and a second comparison device 8 adapted to compare a reference current value called I_seuil with the current values Imes_1 and Imes_2 measured in the transistor bridge 1 by the devices DM1 and DM2, respectively, together with two time counting devices 7 and 9.

In the illustrated embodiment, the control unit 20 comprises an error register 4, for saving an item of information representing the anomalies found for this transistor. The register is set to a high logic state, "1", if an anomaly is detected. In an exemplary embodiment, the unit 20 comprises an error register 4 associated with each type of anomaly monitored, and with each transistor of the H-bridge monitored. For example, the register Err_CO2 is associated with the transistor M2 for open circuit detection. Similarly, the register Err_CO3 is associated with the transistor M3 for open circuit detection.

The control unit 20 is adapted to receive signals from the "application" layer 21, as well as from the "command" layer 23 and/or the "hardware" layer 24. Additionally, the control unit 20 is adapted to deliver, on its outputs 421, 422, 423 and 424, control signals for controlling the MOS power transistors M1, M2, M3 and M4, respectively, of the transistor bridge 1 supplying the motor 3. The control unit 20 further comprises a first input 411 adapted to receive the control signal PWM, a second input 412 adapted to receive another control signal DIR for selecting the direction of current flow in the transistor bridge 1 on the basis of a specified strategy, and a third input 413 adapted to receive a clock signal CLK. Additionally, the control unit 20 comprises an input 417 adapted to receive information from the "application" layer 21, or to transmit information thereto, via a communication bus, for example a serial bus such as an SPI ("Serial Peripheral Interface") bus. The control unit 20 also comprises two other inputs 415 and 416 adapted to receive signals called Mes_seuil_1 and Mes_seuil_2 respectively, from the outputs of the counting devices 7 and 9.

The current measurement devices DM1 and DM2 comprise, for example, a current mirror structure (in FIG. 4a) adapted to measure the current (or a voltage image of the current in FIG. 4b) flowing in the H-bridge. They also comprise outputs adapted to generate signals Imes_1 and Imes_2, representative of the current flowing in the transistor bridge 1, and more specifically in the MOS power transistors M2 and M3, respectively, in the illustrated example.

The use of a current mirror as shown in FIG. 4a consumes little energy, and furthermore does not unbalance the structure of the H-bridge. As a variant, however, as shown in FIG. 4b, it is possible to use a structure called a "shunt structure" which, by means of a resistance positioned in the conduction path of the transistors, can supply a voltage at the terminals of the shunt resistance which is the image of the current in the shunt resistance. This technique of measurement by "shunt resistance" is costly in terms of power consumption and may create problems of current balancing in the H-bridge because a supplementary load is added to the H-bridge.

The current mirror of the current measurement device DM1 of FIG. 4a operates as described below. The transistor M2b is made by the same technology and is subjected to the same temperature as the transistor M2. In fact, its various components are distributed in the same area as the transistor M2. The transistors M2 and M2b are subjected to the same gate-source voltage and the same drain-source voltage. This is an operational amplifier which can be used to keep the difference between the drain voltages at 0, by controlling a MOS transistor which regulates the current flowing through the transistor M2b. If the transistor M2b was of the same size as the transistor M2, the current flowing through the transistor M2b would be very close in value to that flowing through the transistor M2. However, it is not common practice for the transistor M2b to be of the same size as the transistor M2, which is of considerable size owing to its function as a power transistor. Consequently the transistor M2b is smaller in size, and the value of the current Imes_1 flowing through it is therefore proportionately smaller. The same proportion is applied to the comparison current i_seuil, before comparison.

The current mirror of the current measurement device DM2 of FIG. 4a is based on the same principle, for the transistors M3 and M3b.

The first comparison device 6 is adapted to make the comparison between the reference current value called I_seuil and the current Imes_1 measured by the current measurement device DM1, which is the image of the current flowing through the MOS power transistor M2. The first comparison device 6 is adapted to generate a signal OUT_6 representative of the result of the comparison between the measured current value Imes_1 and the reference current value I_seuil. The reference current value I_seuil is determined so that it is less than the value of the mean current flowing through, for example, the MOS power transistor M2 when the duty cycle of the control signal PWM is less than 10%. This reference current value is set by the "application" layer 21 of the system.

The second comparison device 8 is adapted to make a comparison between the reference current value I_seuil and the measured current Imes_2, and is adapted to generate a signal called OUT_8, representative of the result of the comparison between the two input values.

It will be noted that the comparison devices 6 and 8 are adapted to continuously compare the values of the measured currents in the transistors M2 and M3 simultaneously during the control phases of the bridge (when the setpoint signal PWM is in the high state) and during the freewheel phases (when the setpoint signal PWM is in the low state).

The first counting device 7 is adapted to receive the signal OUT_6 from the first comparison device 6, and the second counting device 9 is adapted to receive the signal OUT_8 from the second comparison device 8. Each of these devices may comprise a counter of pulses of the clock signal CLK, making it possible to count the time for which the corresponding comparison signal, namely OUT_6 or OUT_8 respectively, is in the high logic state. They may also be adapted to receive a signal τ0 and a set of signals T0 (enabling the counting to be initialized for a time interval T0). The counting devices 7 and 9 are adapted to deliver output signals toward the control unit 20 on the basis of a specified strategy described in greater detail below.

To avoid any detection error when the current flowing through the H-bridge is low, the signal τ0 advantageously enables the time counting functions of the counters of the counting devices 7 and 9 to be disabled when the duty cycle of the control signal PWM is less than 10%. Additionally, if the signal τ0 is representative of a duty cycle of the control signal PWM which is less than 10%, the counting is also disabled and the counters of the counting devices 7 and 9 are reset to zero.

The counting devices 7 and 9 are adapted to count a time interval during which the value of the current flowing through the H-bridge is less than the reference current value I_seuil, and to deliver a signal Mes_seuil_1 for the first counting device 7 and Mes_seuil_2 for the second counting device 9, if the counted time interval is greater than the value T0.

In an exemplary implementation of the counting devices 7 and 9, the binary value corresponding to T0 is loaded when the input OUT_6 or OUT_8 is in the low state, and this is counted down to a zero value, which triggers the high state at the output Mes_seuil_1 or Mes_seuil_2.

Another example is that of loading a binary value complementary to T0, so as to provide the same function by incrementation. It is the incrementation algorithm that will be used in the following text, purely in order to simplify the explanations.

The value T0 is equal to k times the period T of the control signal PWM, where k is a real number which is greater than unity in all cases, and preferably greater than 2. The adoption of a time interval T0 for counting advantageously enables the open circuit detection information to be filtered in time, thus avoiding the effects of transient phenomena.

In FIG. 4c, the comparison with the current threshold in the comparison devices 6 and 8 is integrated into the current measurement devices DM1 and DM2, respectively. For the first current measurement device DM1, an image of Iseuil is injected in the form of Iref into M2b, and the drain voltages of the transistors M2 and M2b are compared, thus providing the signal OUT_6 directly. Similarly, for the second current measurement device DM2, the comparison of the drain voltages of the transistors M3 and M3b provides the signal OUT_8.

Figure 5:
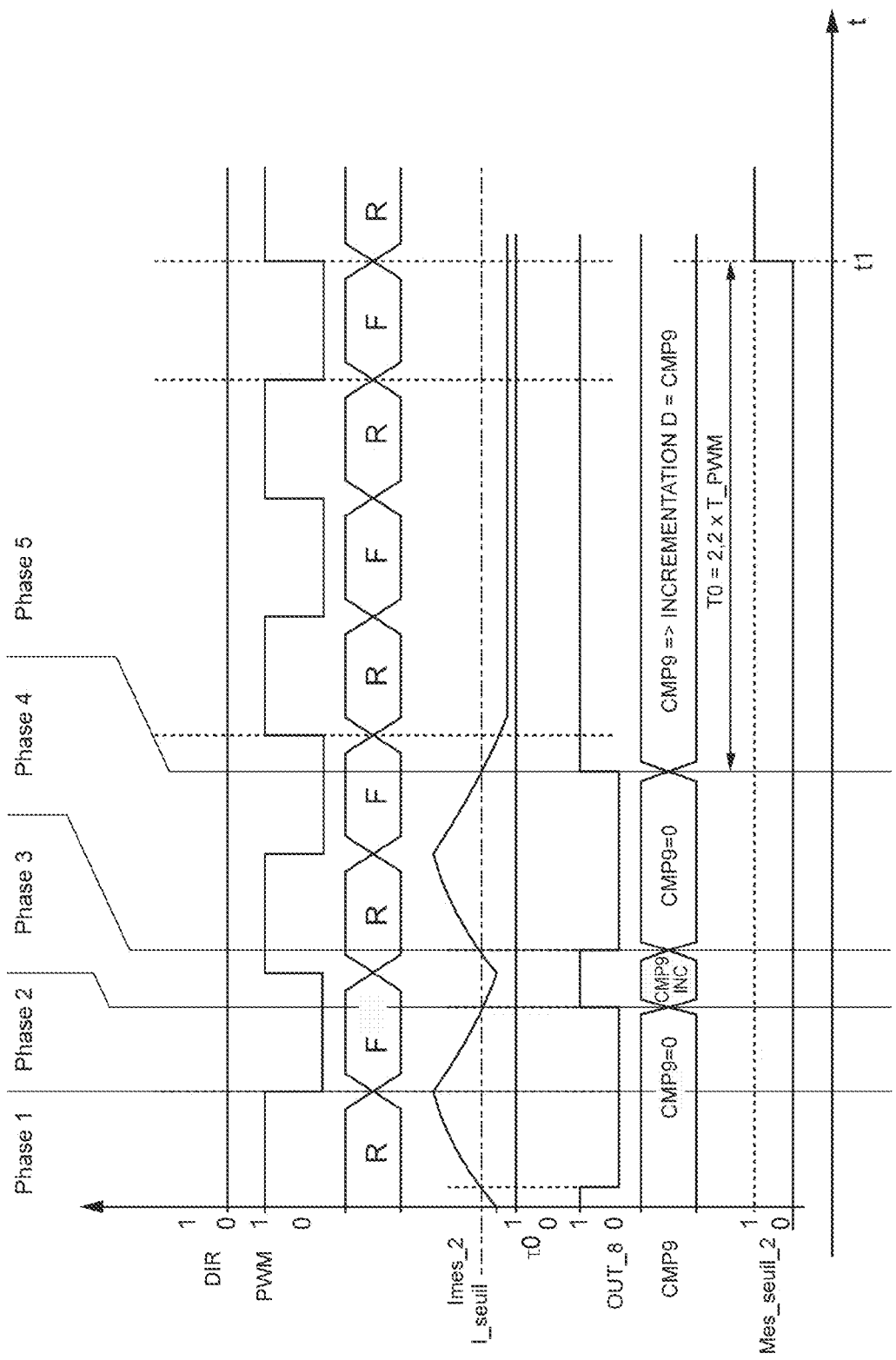
FIG. 5 shows graphs representing the different control and measurement signals corresponding to the detection of an anomaly of the open circuit type.

FIG. 5 shows graphs of signals representative of an open circuit which may occur in an H-bridge structure. To simplify the description, FIG. 5 has been divided into five phases. The duty cycle of the operating signal PWM in the example as shown here is equal to 50%.

The first two graphs at the top of FIG. 5 show the direction signal DIR and the setpoint signal PWM, which can be used to control the H-bridge as explained above. The next graph indicates the states of the H-bridge as a function of the direction signal DIR and setpoint signal PWM. The next graph represents the signal I_mes 2 at the input of the second comparison device 8, the horizontal broken line showing the level of the reference current value I_seuil determined by the "application" layer 21. The graph of OUT_8 represents the output of the second comparison device 8. The graph CMP9 represents the state of the counter of the second counting device 9, and the last graph Mes_seuil_2 corresponds to the logical value at the output of this second counting device 9.

In phase 1 in FIG. 5 the control signal DIR is in the low logic state (with a logical value of "0") and the control signal PWM is in the high state. This combination of the two control signals puts the H-bridge into a state in which, for example, the motor 3 can be controlled in a direction of rotation called reverse, and denoted "R" in FIG. 5, by convention (the actual direction of rotation of the motor 3 also depends on the way in which OUT1 and OUT2 are connected to the motor 3). As explained above, the signal Imes_2 progresses and increases slowly because of the inductive nature of the motor 3, and is always greater than the reference current value I_seuil. The second comparison device 8 generates a value of "0" on its output OUT_8, signifying that the measured current value Imes_2 is greater than the reference current value I_seuil.

The second counting device 9 receives the signal τ0 whose value is "1", representing a duty cycle of the control signal PWM which is greater than 10%. As described above, the logical value "1" of the signal τ0 activates the second counting device 9. Because of the low logic state of the output signal OUT_8 of the second comparison device 8, the second counting device 9 does not actuate the counting, and therefore generates a logical value of "0" on its output Mes_seuil_2.

In phase 2 on the graph of FIG. 5, the value of the control signal PWM changes to the low state (with a logical value of "0"), causing the H-bridge to be put into the freewheel state. The current flowing in the H-bridge decreases because of the inductive nature of the load and the electromotive force generated by the motor 3. The measured current Imes_2 decreases, but remains greater than the reference value I_seuil during phase 2. The output signal of the comparison device remains at "0", and the counter of the second counting device 9 is not activated; consequently the signal Mes_seuil_2 at the output of the second counting device 9 remains at the logical value "0".

During phase 3, the measured signal I_mes_2 is, and remains, below the reference value I_seuil, and this continues through the end of the freewheel (control signal PWM="0") and the start of the control of the bridge (control signal PWM="1"). Since the measured value Imes_2 is below the reference value I_seuil, the signal OUT_8 at the output of the second comparison device 8 is set to "1", causing the activation of the counter of the second counting device 9, and therefore the start of counting. The value of the counter is incremented at each edge of the clock signal CLK (not shown) as long as the value of the measured current Imes_2 remains below the reference value I_seuil.

At the start of phase 4, the value of the measured current Imes_2 becomes greater than the reference current value I_seuil, and this continues throughout phase 4, causing the signal OUT_8 at the output of the second comparison device 8 to be set to "0". The setting of the output OUT_8 to "0" also causes the counter of the second counting device 9 to be reset to zero. Since the output of the second counting device 9 was not set to "1" in the preceding phase, it remains at "0".

At the start of phase 5, the value of the measured current Imes_2 becomes lower than the reference current value I_seuil, and this continues throughout more than one period of the control signal PWM. The output OUT_8 of the second comparison device 8 is set to the logical value "1". The counter of the second counting device 9 is activated, and the counting continues as long as the signal OUT_8 is at "1". In spite of the alternation of the control and freewheel phases of the H-bridge, the measured signal Imes_2 remains at a value below the reference current value I_seuil. The value of the counter of the second device 9 is incremented and, at the instant t1, reaches the value T0 which is transmitted by the "application" layer 21. In the example of FIG. 5, the value T0 is equal to 2.2 times the period T of the control signal PWM. If the value of its counter is greater than the value of T0, the second counting device 9 sets its output Mes_seuil_2 to the logical value "1", which represents an open circuit at the transistor M3 of the H-bridge. The signal Mes_seuil_2 is sent to an input 416 of the control unit 20, and the register Err_CO3 corresponding to an open circuit at the transistor M3 is set to the logical value "1".

In this case, according to a specified strategy, the control unit 20 can deliver to the "application" layer 21 an item of information about the detection of an open circuit in a specified transistor via the communication bus SPI 417. Action may be taken at the "application" layer 21, for example by delivering an error message, informing the after-sale and repair service of the nature of the anomaly during a maintenance operation on the vehicle.

The above description has been given purely by way of illustration, and for the case of the MOS power transistor M3 only. This exemplary embodiment is equally valid for the MOS power transistor M2. Any technically feasible variant embodiment may be preferred to the embodiments described. For example, the comparison devices 6 and 8 may be produced using external circuits or logic gates and associated circuitry, for providing the same function as that described in the invention.

Similarly, the value T0, as well as the reference value I_seuil, are given by way of illustration and are not limited to the examples given herein, and may have any other value according to the system of embodiment.

Finally, the invention is evidently applicable to the control of any inductive load, not only an electric motor. The load may be, for example, an electromagnetic actuator with a fixed coil and a moving core.

The invention claimed is:

1. A device for supplying power to an inductive load (3), comprising:
    a switching structure (M1-M4) comprising at least one power switch, and adapted to control a continuous current in the inductive load (3) on the basis of at least one control signal (PWM) of the at least one power switch, the control signal being pulse width modulated,
    anomaly detection means, adapted to generate at least one item of information about the detection of an anomaly of the open circuit type in the wiring from the inductive load (3) to the switching structure (M1-M4),
    wherein the anomaly detection means comprise:
        current measurement means (DM1, DM2) adapted to measure the current (Imes_1, Imes_2) continuously in the inductive load (3),
        comparison means (6, 8) adapted to compare the measured current continuously with a threshold current value (I_seuil),
        counting means (7, 9) for counting a time interval during which the measured current (Imes_1, Imes_2) remains continuously below the current threshold value (I_seuil), and for delivering the anomaly detection information if:
            the counted time interval is greater than a specified reference time interval (T0), which is k times greater than a period (T_PWM) of the control signal (PWM) of the at least one power switch, where k is a number greater than unity, and
            the duty cycle of the control signal (PWM) is greater than a threshold value (τ0).

2. The device as claimed in claim 1, wherein the threshold value of the duty cycle of the control signal (PWM) is at least equal to 10%.

3. The device as claimed in claim 1, further comprising serial communication means (417) adapted to enable the device to communicate with a control unit (20) outside the device.

4. The device as claimed in claim 3, comprising a storage register adapted to store the threshold value of the duty cycle received from the external control unit (20) via the serial communication means in the form of a uniform value at a time.

5. The device as claimed in claim 1, further comprising programmable storage means, adapted to store a modifiable value of the current threshold (I_seuil).

6. The device as claimed in claim 5, wherein the programmable storage means are programmed by the external control unit (20) via the serial communication means (417).

7. A method for supplying power to an inductive load (3) using a device comprising:
- a switching structure (M1-M4) comprising at least one power switch, and adapted to control a continuous current in the inductive load (3) on the basis of at least one control signal (PWM) of the at least one power switch, the control signal being pulse width modulated, and
- anomaly detection means, adapted to generate at least one item of information about the detection of an anomaly of the open circuit type in the wiring from the inductive load (3) to the switching structure (M1-M4), the method comprising:
- measuring the current in the inductive load (3);
- comparing the measured current (Imes_1, Imes_2) with a current threshold value (I_seuil);
- counting a time interval during which the measured current (Imes_1, Imes_2) remains continuously below the current threshold value (I_seuil); and
- delivering the anomaly detection information if the counted time interval is greater than a specified reference time interval (T0), which is k times greater than a period (T_PWM) of the control signal (PWM) of the at least one power switch, where k is a number greater than unity, and if the duty cycle of the control signal (PWM) is greater than a threshold value ($\tau 0$).

8. The method for supplying power to an inductive load (3) as claimed in claim 7, wherein the threshold value ($\tau 0$) of the duty cycle of the control signal (PWM) is at least equal to 10%.

9. The device as claimed in claim 2, further comprising serial communication means (417) adapted to enable the device to communicate with a control unit (20) outside the device.

10. The device as claimed in claim 2, further comprising programmable storage means, adapted to store a modifiable value of the current threshold (I_seuil).

11. The device as claimed in claim 3, further comprising programmable storage means, adapted to store a modifiable value of the current threshold (I_seuil).

12. The device as claimed in claim 4, further comprising programmable storage means, adapted to store a modifiable value of the current threshold (I_seuil).

* * * * *